US012642022B2

(12) United States Patent
Wood et al.

(10) Patent No.: US 12,642,022 B2
(45) Date of Patent: May 26, 2026

(54) PLASMA ETCHING

(71) Applicant: SPTS Technologies Limited, Newport (GB)

(72) Inventors: Alex Wood, Newport (GB); Kevin Riddell, Newport (GB); Huma Ashraf, Newport (GB)

(73) Assignee: SPTS Technologies Limited, Newport (GB)

( * ) Notice: Subject to any disclaimer, the term of this patent is extended or adjusted under 35 U.S.C. 154(b) by 242 days.

Patent file contains an affidavit/declaration under 37 CFR 1.130(b).

(21) Appl. No.: 18/075,128

(22) Filed: Dec. 5, 2022

(65) Prior Publication Data

US 2023/0197457 A1 Jun. 22, 2023

(30) Foreign Application Priority Data

Dec. 17, 2021 (GB) ...................................... 2118372

(51) Int. Cl.
*H01L 21/3065* (2006.01)
*H01L 21/02* (2006.01)
(Continued)

(52) U.S. Cl.
CPC .... *H01L 21/3065* (2013.01); *H01L 21/02389* (2013.01); *H01L 21/02631* (2013.01);
(Continued)

(58) Field of Classification Search
CPC ...... H10P 50/242; H10P 50/695; H10P 14/22; H10P 14/2908; H10P 72/0604;
(Continued)

(56) References Cited

U.S. PATENT DOCUMENTS 9,484,216 B1 * 11/2016 Bauer .................. H10N 30/082
9,634,226 B2 4/2017 Takahashi et al.
(Continued)

FOREIGN PATENT DOCUMENTS

CN 113991009 A 1/2022
EP 3843126 A1 6/2021
(Continued)

OTHER PUBLICATIONS

Luo, Zhifang et al., "Characterization of AlN and AlScN film ICP etching for micro/nano fabrication" Microelectronic Engineering 242-243 (2021) 111530, available online Feb. 27, 2021. (Year: 2021).*

(Continued)

*Primary Examiner* — Anita K Alanko
(74) *Attorney, Agent, or Firm* — Hodgson Russ LLP

(57) ABSTRACT

An additive-containing aluminium nitride film containing an additive element selected from Sc, Y or Er is plasma etched through a mask for a period of time, t, with a plasma formed in a gaseous atmosphere having an associated gas pressure while an RF bias power is applied to the additive-containing aluminium nitride film. The gas pressure is reduced and/or the RF bias power is increased for a majority of the period of time t, so that the plasma etching becomes less chemical and more physical over a majority of the period of time, t.

18 Claims, 6 Drawing Sheets

(51) Int. Cl.

| | |
|---|---|
| H01L 21/308 | (2006.01) |
| H01L 21/67 | (2006.01) |
| H01L 21/768 | (2006.01) |
| *H01J 37/32* | (2006.01) |
| *H10N 30/082* | (2023.01) |

(52) U.S. Cl.
CPC .... H01L 21/3086 (2013.01); H01L 21/67253 (2013.01); H01L 21/76862 (2013.01); *H01J 37/32174* (2013.01); *H01L 21/67207* (2013.01); *H10N 30/082* (2023.02)

(58) Field of Classification Search
CPC ............. H10P 72/0468; H01L 21/3065; H01L 21/02389; H01L 21/02631; H01L 21/3086; H01L 21/67253; H01L 21/76253; H01L 21/76862; H01L 21/27207; H10W 20/0523; H01J 37/32174; H10N 30/082
USPC ................................................ 252/79.1–79.5
See application file for complete search history.

(56) References Cited

U.S. PATENT DOCUMENTS

| | | | |
|---|---|---|---|
| 2015/0333727 A1 | 11/2015 | Moulard et al. | |
| 2018/0130883 A1* | 5/2018 | Hardy ................. | H01L 21/3081 |
| 2023/0170188 A1* | 6/2023 | Wood ................ | H01J 37/32449 |
| | | | 216/41 |

FOREIGN PATENT DOCUMENTS

| | | | |
|---|---|---|---|
| JP | 2005-523587 | A | 8/2005 |
| JP | 2012-124218 | A | 6/2012 |
| WO | 2020/121804 | A1 | 6/2020 |

OTHER PUBLICATIONS

IPO, Search Report for GB2118372.8, May 25, 2022.

Luo et al., Optimization of AlN and AlScN Film ICP Etching, IEEE MEMS 2021 Virtual Conference, 638-641, 2021.

Colombo et al., Investigation of 20% Scandium-doped Aluminum Nitride Films for MEMS Laterally Vibrating Resonators, IEEE Int'l Ultrasonics Symposium, 1-4, 2017.

Wang et al., A Film Bulk Acoustic Resonator Based on Ferroelectric Aluminum Scandium Nitride Films, J. of Microelectromechanical Systems, 741-747, vol. 29, No. 5, Oct. 2020.

Firek et al., "Plasma etching of aluminum nitride thin films prepared by magnetron sputtering method," PSE Conferences, Sep. 1, 2012.

EPO, Extended European Search Report for EP Application No. 22210372.3, May 11, 2023.

Henry et al., AlN and ScAlN Contour Mode Resonators for RF Filters, Report No. SAND2017-5609C, 2017, 1-10, 653629.

Henry et al., AlN and ScAlN Contour Mode Resonators for RF Filters, Report No. SAND2017-5608C, 2017, 653628.

Kusano et al., High-SPL Air-Coupled Piezoelectric Micromachined Ultrasconic Transducers Based on 36% ScAlN Thin-Film, IEEE Trans. on Ultrasonics, Ferroelectrics, and Frequency Control, Sep. 2019, 1488-1496, vol. 66, No. 9.

Japanese Intellectual Property Office, Office Action issued in Japanese Application No. 2022-194037, dated Jan. 13, 2026.

* cited by examiner

PLASMA ETCHING

CROSS-REFERENCE TO RELATED APPLICATIONS

This application claims priority to UK Patent App. No. 2118372.8 filed Dec. 17, 2021, the disclosure of which is hereby incorporated by reference.

FIELD OF THE DISCLOSURE

This invention relates to plasma etching, with particular reference to methods of plasma etching an additive-containing aluminium nitride film containing an additive element selected from Sc, Y or Er. The invention relates also to associated apparatus for plasma etching an additive-containing aluminium nitride film.

BACKGROUND OF THE DISCLOSURE

AlScN (aluminium scandium nitride) is seeing increased use as a piezoelectric material in a wide range of applications due to its superior piezoelectric properties in comparison to AlN. Application areas include 5G and MEMS. Specific examples include Bulk Acoustic Wave (BAW) filters and Piezoelectric Micromachined Ultrasonic Transducers (PMUT) for use in 5G, object detection, gesture recognition and assisted driving applications. AlScN is more challenging to plasma etch than AlN due to the deposition of Sc by-products onto the etch sidewall. This by-product is undesirable as it acts as a local mask for the etch front, thus resulting in an undesirable multi-stepped sidewall profile post-etch. Also, the by-product must be removed after processing and prior to any subsequent deposition onto the etched structure.

AlN etches readily in chlorinated plasmas to form gaseous $AlCl_x$ by-products which desorb from the etched surface without giving rise to significant amounts of sidewall redeposition. However, AlScN etches in a slightly different manner. Unlike Al, Sc has very few volatile by-products and therefore is prone to the formation of redeposition material which builds up in considerable thickness on the etched AlScN sidewall. Material is sputtered from the trench base and lands on the etch sidewall and mask wall. Subsequent sputtering of the sidewall removes some but not all of the redeposition material. The net redeposition thickness is determined by the sputter deposition rate minus the sputter removal rate. The sputter removal rate is dependent on the mask thickness, mask angle and etch conditions such as pressure and DC bias.

A thick mask, with a steep sidewall angle, is often used in AlScN etching. By-product sputtered from the base of the etched trench can readily redeposit on this type of mask. Consequently, redeposition rapidly builds up on the mask and etch sidewalls. This redeposition inhibits the etch front underneath, whilst the AlScN further away from the sidewall is free to etch, creating a multi-stepped sidewall profile which is undesirable for some devices. Additionally, the presence of redeposition at the end of the etch is also undesirable, as it will impact on any subsequent film deposition onto the etched structure, necessitating the use of a post etch clean to facilitate removal. This is an undesirable extra processing step.

The multi-stepped sidewall profile is regularly observed when etching AlScN films and can be challenging to avoid. Where a photoresist mask is used, a common prevention method is to use a thermal reflow to soften the edges of the mask sidewall, resulting in a shallower pre-etch mask sidewall angle. The rate of redeposition removal is increased as surfaces become less vertical—essentially, the sidewall is more exposed to the DC bias of the plasma as the angle becomes shallower. For the mask, a sloped angle allows more sputter redeposition to directly escape from the trench, rather than landing on the mask sidewall. It also allows more sputtering of the mask and etch sidewall which also reduces the build up of redeposition material.

Reflowing can provide a single-sloped post-etch AlScN sidewall profile. However, this method can have a few drawbacks. Firstly, a shallower AlScN etch profile is produced due to increased recession rates of a shallower angled mask. Secondly, if there are a range of feature sizes, shapes and CDs (critical dimensions) to be etched, then the photoresist reflow will lead to an inconsistent pre-etch mask sidewall angle due to a varying photoresist surface tension across the feature and die. The post-etch AlScN sidewall profile is highly dependent on the pre-etch mask sidewall profile, and therefore reflow leads to a range of post-etch AlScN sidewall angles, which is undesirable. Thirdly, the risk of forming a multi-stepped profile is not eliminated. This is due to inconsistent recession rates if the slope of the photoresist is not consistent post-reflow. A further problem is that this approach cannot be used for masks that will not reflow, for example $SiO_2$ hard masks and cross-linked negative photoresist masks. In these cases, a shallow angle must be developed, for example at the lithography opening step, or redeposition and/or multi-stepped AlScN sidewall angles will result.

Another known solution attempts to minimise the build up of redeposition material through the use of low pressure, high DC bias process regimes which increase the sputter removal rate of redeposition from the sidewall. These process regimes can be characterised as regimes that favour physical etching. Generally, these regimes have a low selectivity to photoresist and $SiO_2$ masks, thereby promoting mask recession and exposing the underlying AlScN to the plasma. This results in CD loss and a multi-angled etch sidewall. FIG. 1 is a semi-schematic representation of a typical progression of an etch sidewall during plasma etching of an AlScN layer 100 on a substrate 102 using an $SiO_2$ mask 104 to define the area to be etched. FIG. 1(*a*) shows the layer 100 and mask 104 prior to the commencement of etching. FIG. 1(*b*) shows the layer 100 and mask 104 soon after the commencement of etching. FIG. 1(*c*) shows the layer 100 and mask 104 close to the end of etch process.

AlScN typically has half the etch selectivity to photoresist masks than it does for $SiO_2$. As a result, it is generally necessary for photoresist masks to be approximately double the thickness of $SiO_2$ masks in to achieve a given target etch depth. For an AlScN etch with a Sc atomic percentage content of 20% and an open area of greater than 20%, a selectivity to photoresist masks of ~0.5:1 and selectivity to $SiO_2$ of ~1:1 is typical. The thicker photoresist mask increases the catchment area of non-volatile Sc by-products, increasing the build-up of redeposition material even in physical etching process regimes, potentially leading to a multi-angled sidewall profile and redeposition remaining in place on the sidewall at the end of the etch. At higher scandium percentages, the AlScN etch rate drops, resulting in a lower selectivity to photoresist masks. As a result, an even thicker mask would be required when Sc is present in high concentrations, thereby exacerbating the problems described above. FIG. 2 is a semi-schematic representation of a typical progression of an etch sidewall during plasma etching of an AlScN layer 200 on a substrate 202 using a photoresist mask 204 to define the area to be etched. FIG. 2(*a*) shows the layer 200 and mask 204 prior to the commencement of etching. FIG. 2(*b*) shows the layer 200 and mask 204 soon after the commencement of etching. Redeposition material 206 can be seen on the side walls of the mask 204 and AlScN layer 200. FIG. 2(*c*) shows the layer 200 and mask 204 close to the end of etch process.

What is needed is a plasma etching method and apparatus which addresses the above described problems and desires. In particular, it would be highly desirable to provide an improved plasma etching method and apparatus that can provide a substantially uniform, single angle sidewall while effectively managing Sc based by-products. Further desires include the substantial or even complete avoidance of redeposition material on the completed etched structure, and achievement of higher selectivities than are achievable using conventional prior art plasma etch processes for etching AlScN. A further desire still is to eliminate further process steps, such as a step to remove redeposition material. The present invention, in at least some of its embodiments, addresses the above described problems, needs and desires.

BRIEF SUMMARY OF THE DISCLOSURE

According to a first aspect of the invention there is provided a method of plasma etching an additive-containing aluminium nitride film comprising plasma etching an additive-containing aluminium nitride film containing an additive element selected from Sc, Y or Er through a mask for a period of time, t, with a plasma formed in a gaseous atmosphere having an associated gas pressure while an RF bias power is applied to the additive-containing aluminium nitride film; wherein the gas pressure is reduced and/or the RF bias power is increased for a majority of the period of time t, so that the plasma etching becomes less chemical and more physical over a majority of the period of time, t.

The gas pressure is reduced and/or the RF bias power can be increased at a constant rate of change for a majority of the period of time t.

The gas pressure is reduced and/or the RF bias power can be increased at a rate of change that decreases for a majority of the period of time t.

The gas pressure can be reduced and/or the RF bias power is increased at a rate of change that increases for a majority of the period of time t.

The mask can be a hard mask. The hard mask can be a silicon oxide hard mask.

The mask can be a photoresist mask.

The gas pressure can be reduced and/or the RF bias power increased for at least 75% of the period of time, t, optionally at least 90% of the period of time, t.

The gas pressure can be in the range 0.5 to 25 mTorr, optionally 1 to 15 mTorr, during the plasma etching.

The gas pressure can be reduced by at least half, optionally by at least a quarter, for a majority of the period of time t.

The RF bias power can be in the range 0 to 1500 W, optionally 500 to 1000 W, during the plasma etching.

The RF bias power can be increased by an amount in the range 250 to 500 W for a majority of the period of time t.

The gas pressure can be increased and/or the RF bias power can be reduced during a final portion of the plasma etching. This produces a final etching regime which is more chemical and less physical. This can help to protect an underlayer that the additive-containing aluminium nitride film is disposed on from damage by the etch in the event that the underlayer is exposed to the etch towards the end of the etch process.

The skilled reader will be familiar with chemical and physical etching regimes. Purely chemical plasma etching is generally associated with etching by neutral species, resulting in a generally isotropic, selective etch. Purely physical plasma etching is generally associated with etching by ions, resulting in a generally anisotropic, less selective etch. In practice, it is possible for an etching regime to have both chemical and physical etching components. The present inventors have realised that varying the balance of the chemical and physical components of the etch can give rise to substantial advantages in the etching of various additive-containing aluminium nitrides. The present inventors have realised that this can be achieved by varying the pressure and/or the RF bias power. In particular, higher pressures and lower RF bias powers can be used to provide a more chemical etching regime, whereas lower pressures and higher RF bias powers can be used to provide a more physical etching regime.

The gaseous atmosphere can comprise an etch precursor, optionally in combination with one or more of an inert gas and $H_2$.

The composition of the gaseous atmosphere can be adjusted during the plasma etching. This can be done so that the plasma etching becomes less chemical and more physical. The composition of the gaseous atmosphere can be adjusted to tune one or more of the etch rate, etch selectivity, profile and redeposition formation. The amount of the etch precursor can be adjusted. The flow rate in sccm of the etch precursor can be adjusted. The composition of the gaseous atmosphere can be adjusted by ramping or by one or more step changes.

The gaseous composition can comprise a chlorine containing etch precursor. The gaseous composition can comprise the chlorine containing etch precursor and a Noble gas. The ratio of the flow rate in sccm of the chlorine containing etch precursor to the combined flow rates in sccm of the chlorine containing etch precursor and Noble gas in the gaseous atmosphere can be adjusted between values which are in the range 40 to 100%.

The chlorine containing etch precursor can be $Cl_2$. The Noble gas can be Ar.

The gas pressure can be reduced and/or the RF bias power can be increased by ramping. These process parameters can be ramped over substantially the entire course of the etch, although it is possible to hold the gas pressure and/or the RF bias power at a constant value for a period of time during the etch process. The holding of a process parameter at a constant value can be performed before and/or after the gas pressure and/or the RF bias power is varied. In principle, it might be possible to reduce the gas pressure and/or increase the RF bias power by one or more step changes.

The additive-containing aluminium nitride film can be disposed on a substrate. The substrate can be a monolithic substrate or a composite substrate. A composite substrate may comprise an underlayer having an upper layer formed thereon, wherein the additive-containing aluminium nitride film is disposed on the upper layer. The substrate can comprise a semiconductor material, such as silicon. The substrate can comprise a metallic material. The metallic material can be present as a metallic upper layer on an underlayer. The metallic material can be molybdenum, platinum or tungsten. The substrate can comprise a dielectric material, such as a glass. The underlayer of a composite substrate can comprise a dielectric material, such as a glass.

In these instances, the upper layer formed thereon can be a metallic upper layer, such as Mo, W or Pt. In general, the substrate comprises a non-piezoelectric material. The structure comprising the substrate and the additive-containing aluminium nitride film can be of a type suitable for use as a BAW or PMUT device, or suitable to undergo further processing to produce a BAW or PMUT device, for example by fabricating an additional metallic layer on an upper surface of the additive-containing aluminium nitride film.

The additive-containing aluminium nitride film can be a thin film. A thin film of the additive-containing aluminium nitride can have a thickness of 5 microns or less.

In addition to AlScN, the invention extends also to the etching of AlYN and AlErN. The boiling points of Erbium Chloride and Yttrium Chloride are ~1500° C. while the boiling point of Scandium Chloride is ~960° C. Thus the etch front during etching of AlYN and AlErN also contains residues which would require post-processing by sputtering or other physical removal unless special methods, such as disclosed herein, are used. Y and Er are known to be candidates for future use as additives for AlN based piezoelectric resonators.

According to a second aspect of the invention there is provided an apparatus for plasma etching an additive-containing aluminium nitride film containing an additive element selected from Sc, Y or Er through a mask, the apparatus comprising:

a chamber;

a substrate support disposed within the chamber;

a gas delivery system for providing a gaseous atmosphere in the chamber;

a plasma generation device for sustaining a plasma within the chamber for etching an additive-containing aluminium nitride film containing an additive element selected from Sc, Y or Er through a mask;

an RF power supply for supplying an RF bias power to the substrate support; and a controller configured to control the apparatus to perform plasma etching of the additive-containing aluminium nitride film through the mask for a period of time, t, wherein the controller controls the gas delivery system and the RF power supply to reduce the gas pressure and/or to increase the RF bias power for a majority of the period of time t, so that the plasma etching becomes less chemical and more physical over a majority of the period of time, t.

The plasma generation device can be an ICP (inductively coupled plasma) or TCP (transformer coupled plasma) device.

Whilst the invention has been described above, it extends to any inventive combination of the features set out above, or in the following description, drawings or claims. For example, any features disclosed in relation to the first aspect of the invention may be combined with any features disclosed in relation to the second aspect of the invention and vice versa.

DESCRIPTION OF THE DRAWINGS

Embodiments of the invention will now be described, by way of example only, with reference to the accompanying drawings, in which.

DETAILED DESCRIPTION OF THE DISCLOSURE

Figure 1:
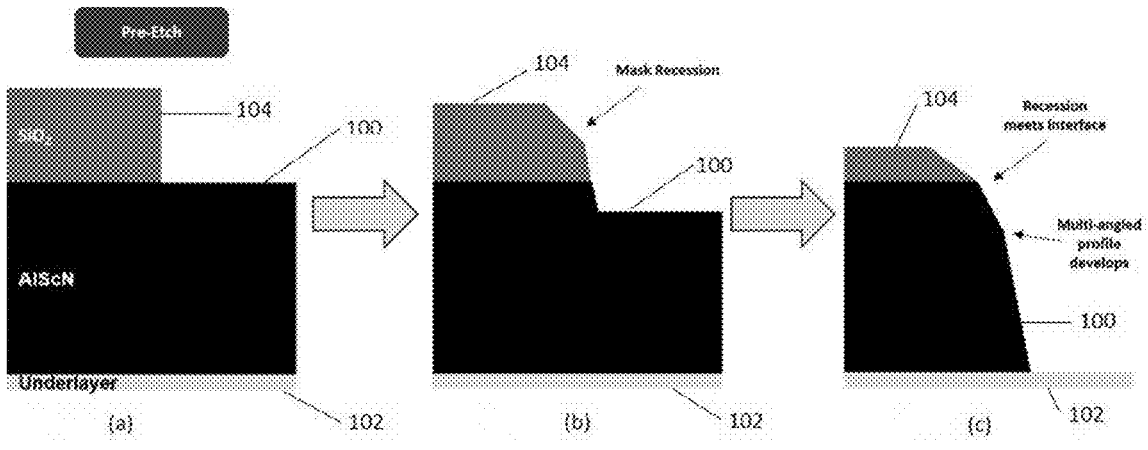
FIG. 1 is a semi-schematic diagram showing an AlScN layer with an $SiO_2$ mask (a) prior to the commencement of a prior art etch process, (b) soon after the commencement of etching, and (c) close to the end of etch process.
Figure 2:
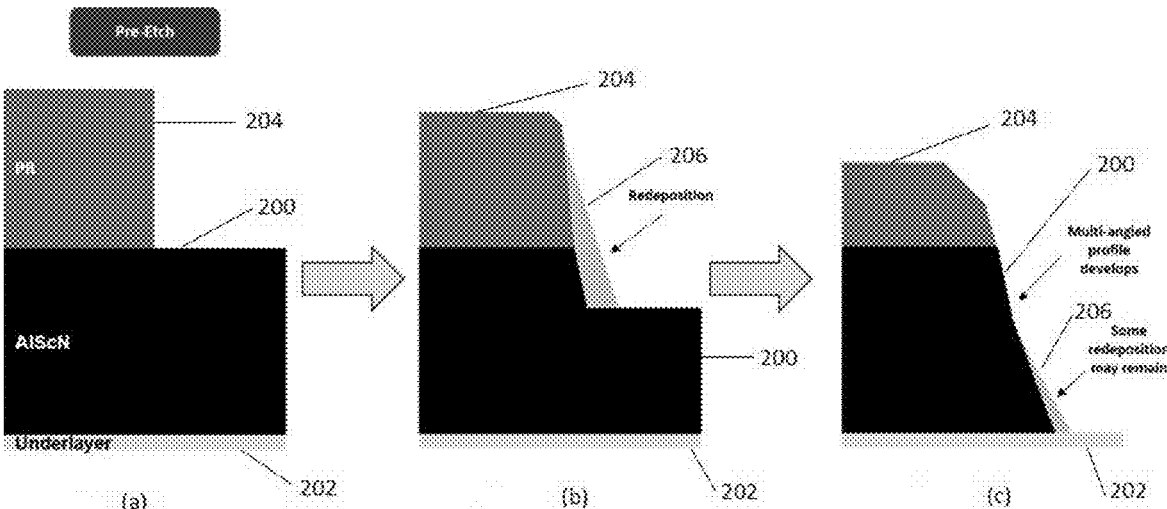
FIG. 2 is a semi-schematic diagram showing an AlScN layer with a photoresist mask (a) prior to the commencement of a prior art etch process, (b) soon after the commencement of etching, and (c) close to the end of etch process.
Figure 3:
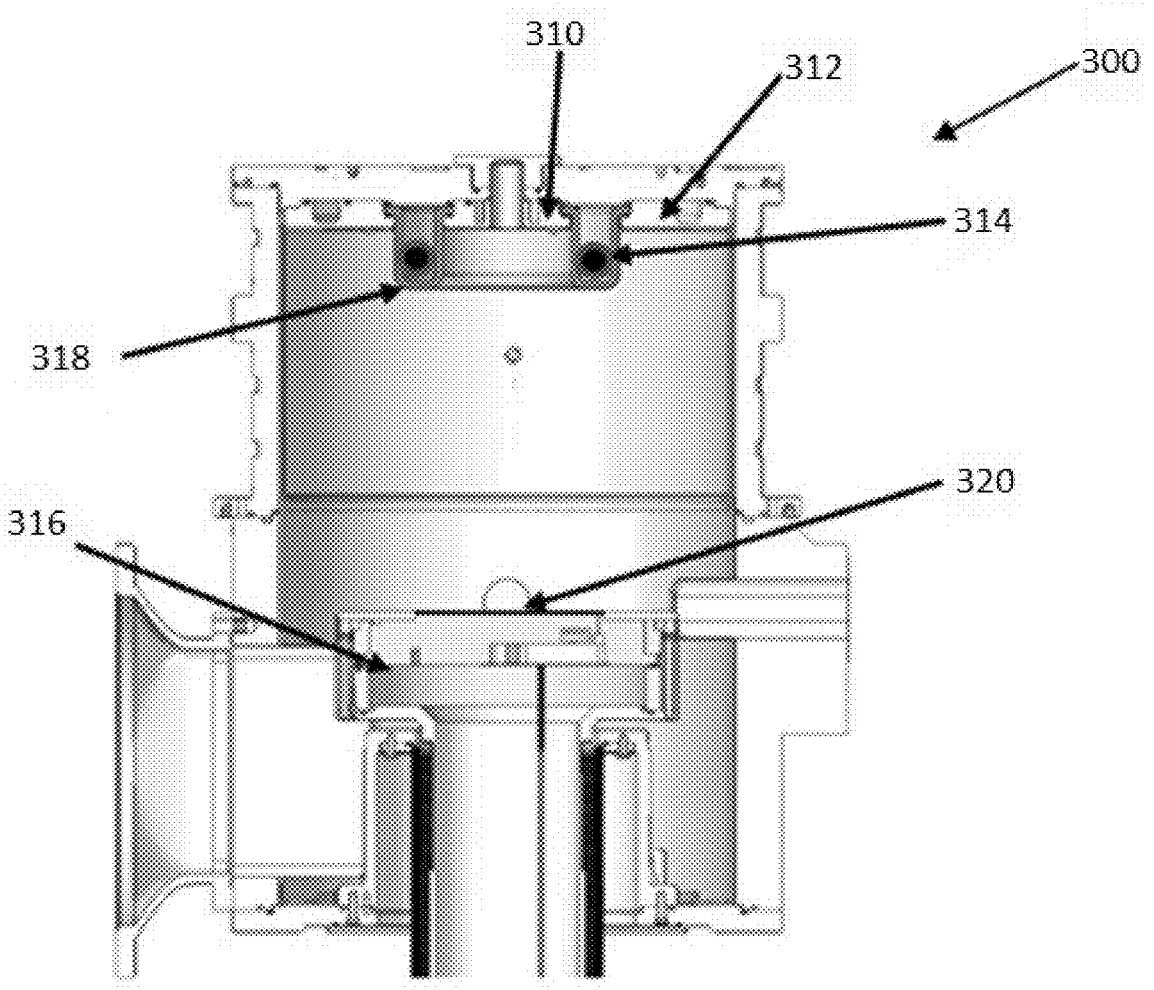
FIG. 3 is a semi-schematic cross sectional representation of an etch apparatus of the invention.
Figure 4:
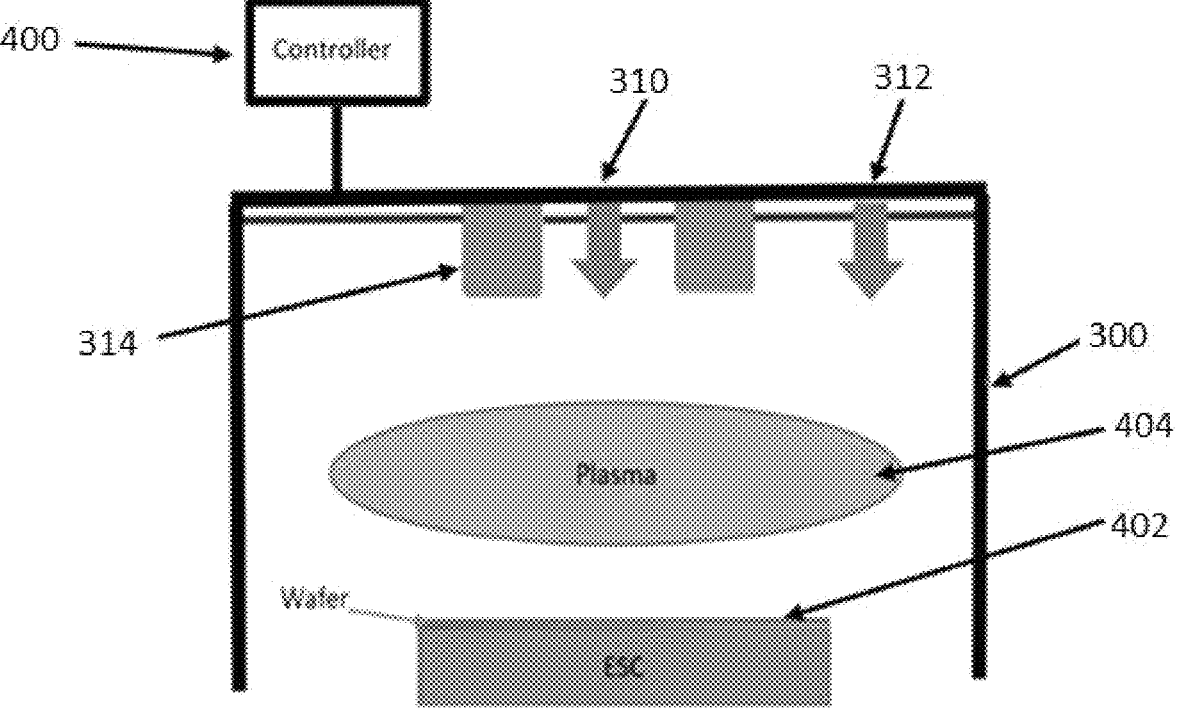
FIG. 4 is a schematic cross sectional representation of an upper part of the etch apparatus of FIG. 3.

The invention can be performed using a wide range of suitably configured plasma etch apparatuses. We have performed experiments using a modified ICP plasma etch apparatus module manufactured by the applicant (an Omega Synapse™ system, which is commercially available from SPTS Technologies Limited, located in Newport, South Wales, UK). Work was conducted on 150 mm silicon wafers with sputtered AlScN thin films of varying Sc concentrations formed thereon with both photoresist and $SiO_2$ hard masks. FIGS. 3 and 4 are representations of a suitably adapted Omega Synapse™ apparatus. The apparatus comprises a chamber 300; a substrate support 320 disposed within the chamber; a gas delivery system 310, 312 for providing a gaseous atmosphere in the chamber; an ICP plasma generation device comprising an RF antenna 314 for sustaining a plasma 404 within the chamber for etching an AlScN film 402 through a mask; an RF power supply (not shown) for supplying an RF bias power to the substrate support 320; and a controller 400 configured to control the apparatus to perform plasma etching of the AlScN film 402 by adjusting various process parameters in ways described herein. The gaseous atmosphere is one that is suitable for etching AlScN. Typically, a chlorine containing etchant is used, optionally in combination with an inert gas such as a Noble gas. Other components, such as hydrogen, may be present as is known in the art. The substrate support 320 can be any suitable element which is connected to receive an RF bias power from the RF power supply. In FIG. 3, the substrate support shown is an electrostatic chuck with a platen RF electrode 316 which receives RF power from the RF power supply. Well known features such as the exhaust gas pumping system and an RF power supply for supplying RF power to the RF antenna 314 are not shown in FIG. 1 but will be well understood by the skilled reader. The frequencies supplied to the RF antenna 314 and to the substrate support 320 were both 13.56 MHz. However, frequencies over the range 2-13.56 MHz could be used for the RF antenna 314 while frequencies from 380 kHz-13.56 MHz could be used for the RF bias applied to the substrate support.

The chamber 300 has an upper wall or lid. A ceramic annular housing 318 is immersed within the chamber 300 and depends downwardly from the upper wall. The annular housing 318 defines a circular region on the interior of the upper wall in which the RF antenna 314 is disposed. The gas delivery system comprises a first gas inlet arrangement 310 and a second gas inlet arrangement 312. In the embodiment shown in FIG. 1, the first gas inlet arrangement 310 is an inner gas plenum and the second gas inlet arrangement 312 is an outer gas plenum. Each gas inlet arrangement comprises a plurality of gas inlets, each gas inlet terminating in an opening through which process gases enter the interior of the chamber 300. The inner plenum 310 sits within the circular region defined by the annular housing 318. The gas inlets of the inner gas plenum 10 are positioned inwardly of the annular housing 318 as a plurality of openings disposed in a circular pattern. The outer plenum 312 is positioned outside the circular region defined by the annular housing 318. The gas inlets of the outer gas plenum 310 are positioned outwardly of the annular housing 318 as a plurality of openings disposed in a circular pattern. The inner gas plenum can have eight gas inlets whereas the outer gas plenum may have about 10 times as many gas inlets. However, it will be appreciated that the first and second gas inlet arrangements can have any suitable number of gas inlets. Further constructional details relating to the apparatus shown in FIGS. 3 and 4 can be found in the applicant's European patent application EP 3843126 A1.

Other types of ICP etch apparatus might be used instead. For example, it is not necessary for the gas delivery system to comprise a first and a second gas inlet arrangement, and neither is it necessary that switching of the gas entry points (as described in EP 3843126 A1) is used in connection with the present invention. Also, other types of plasma generation devices might be used, such as TCP devices.

The invention involves the adjustment of various process parameters during the plasma etching of AlScN. This has been found to increase the selectivity to masks in AlScN plasma etching. We demonstrate that this can prevent mask recession related pull-back, whilst controlling sidewall redeposition build up. In this way, a continuous, steep, single angled sidewall can be achieved without the necessity for a reflow or a shallow pre-etch mask. Because a reflow is not required, its drawbacks are avoided, meaning that the profile is, within reason, consistent across a range of etch feature CDs, shapes and sizes.

The etch process begins in a more chemical etching regime, and then transitions into a more physical etch regime. This has been found to overcome what we have recognised as limitations of the physical process regime which is typically used in prior art AlScN etch processes. In general, a more chemical etching regime is associated with higher pressures and lower RF biases. However, without wishing to be bound by any particular theory or conjecture, it is likely that even the more chemical etching regime used at the beginning of the process will have a physical etching component, and similarly the more physical etching regime that is provided subsequently will likely have a chemical component. Nevertheless, it is in principle possible for portions of the etch process to be essentially chemical and/or essentially physical in nature.

The technique is effective for both photoresist and hard masks. However, the process conditions used for optimal etching differs dependent on the mask types, as is detailed below.

Hard Mask (SiO$_2$)

Figure 5:
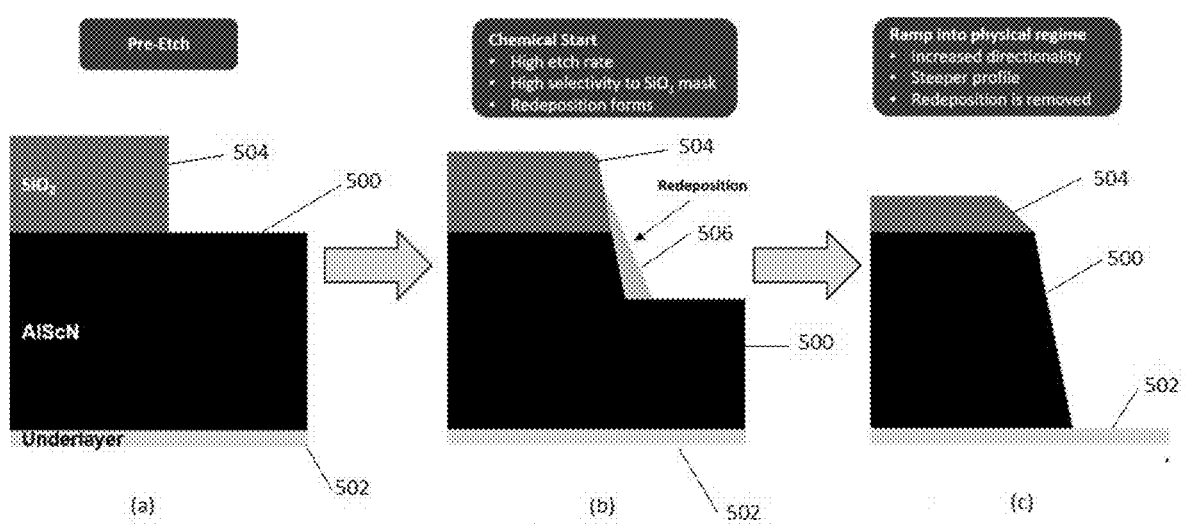
FIG. 5 is a semi-schematic diagram showing an AlScN layer with an $SiO_2$ mask (a) prior to the commencement of etching, (b) soon after the commencement of etching, and (c) close to the end of etch process.

Essentially, the process starts in a relatively high pressure, low bias regime which increases the AlScN etch rate whilst minimising the SiO$_2$ etch rate, resulting in an increased selectivity to the mask. This ensures that the final etch profile is not compromised by lateral mask recession during the final stages of the etch. In this chemical regime however, there is a net build-up of redeposition. To remove this, the process is then modified into a physical regime by decreasing gas flow and pressure whilst increasing the platen RF power. These changes increase the sputter removal rate of the redeposition, whilst also driving the etch to a more directional regime, resulting in a steeper sidewall angle. Correct balancing of the starting conditions, transition period and ending conditions results in removal of redeposition before a significant step in the AlScN sidewall profile is formed. This gives rise to a redeposition free, steep, single-angled sidewall profile. FIG. 5 is a semi-schematic diagram showing steps in the plasma etching of an AlScN layer 500 using this mechanism. The AlScN layer 500 is formed on a substrate 502 using a SiO$_2$ hard mask 504 to define the area to be etched. FIG. 5(a) shows the layer 500 and mask 504 prior to the commencement of etching. FIG. 5(b) shows the layer 500 and mask 504 soon after the commencement of etching. Redeposition material 506 can be seen on the side walls of the mask 504 and AlScN layer 500. FIG. 5(c) shows the layer 500 and mask 504 close to the end of etch process. Although the process has been exemplified with a SiO$_2$ hard mask, it can be used in conjunction with other types of hard masks, such as heavily crosslinked photoresist masks.

Photoresist Mask

Figure 6:
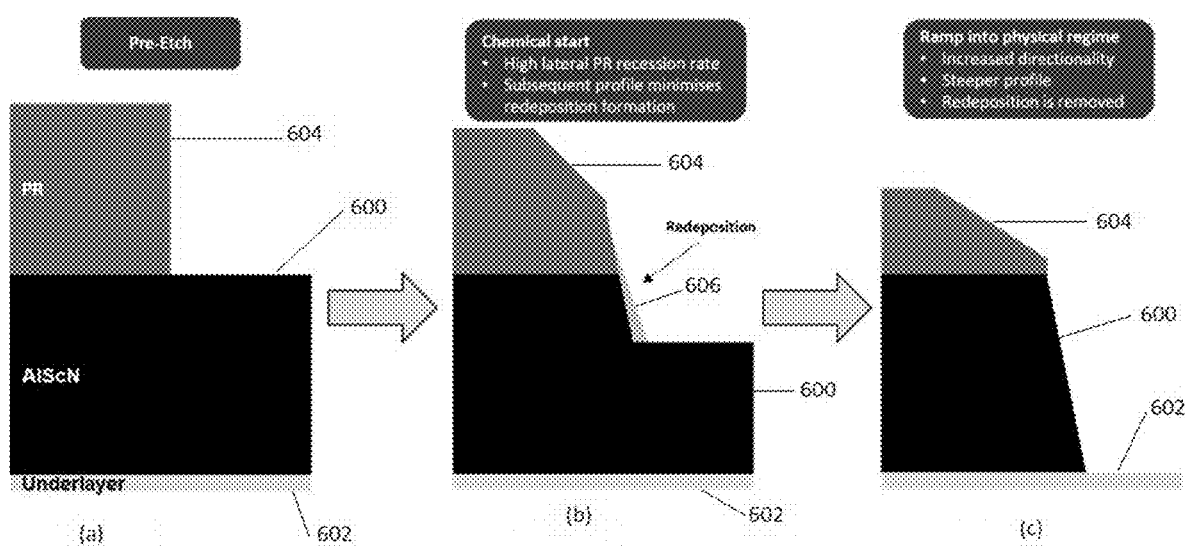
FIG. 6 is a semi-schematic diagram showing an AlScN layer with a photoresist mask (a) prior to the commencement of etching, (b) soon after the commencement of etching, and (c) close to the end of etch process.

Due to the increased thickness of the photoresist mask, there is a need to reduce the mask angle to decrease the redeposition catchment area whilst increasing the rate of its removal. As with the SiO$_2$ mask, the process begins in a high pressure, low bias regime. However, due to the lower selectivity of the PR mask, this less directional, more chemical regime increases the lateral etch of the PR mask, effectively resulting in a thinner, shallower mask at the interface between the mask and the AlScN layer. This minimises the catchment area for redeposition and increasing the line-of-sight for ions. The process then changes into a higher bias, lower pressure regime, which has the effect of both increasing the rate of redeposition removal and the etch sidewall angle. FIG. 6 is a semi-schematic diagram showing steps in the plasma etching of an AlScN layer 600 using this mechanism. The AlScN layer 600 is formed on a substrate 602 using a SiO$_2$ hard mask 604 to define the area to be etched. FIG. 6(a) shows the layer 600 and mask 604 prior to the commencement of etching. FIG. 6(b) shows the layer 600 and mask 604 soon after the commencement of etching. Redeposition material 606 can be seen on the side walls of the mask 604 and AlScN layer 600. FIG. 6(c) shows the layer 600 and mask 604 close to the end of etch process.

By way of example only, a typical etch process is described in Table 1. The process was used in conjunction 150 mm wafers, but with is effective with various wafer sizes. H$_2$ and inert gases can also be added to the process gases to modify the etch characteristics. In relation to flow rates expressed in sccm, the percentage of Ar used in the process is typically between 0-60%, and the percentage of Cl$_2$ is typically between 40-100%. It is possible to use Cl$_2$:Ar flow rate (in sccm) ratios which are outside of these ranges. However, below 40% Cl$_2$ the etch rate would be expected to drop considerably and a worsening of the within-wafer etch non-uniformity would be expected. It is possible to adjust the ratio of Ar:Cl$_2$ during the course of the etch. An adjustment can be made at the start and/or during and/or the end of the etch to tune one or more of the etch rate, etch selectivity, profile and redeposition formation. It will be appreciated that control of the flow rates can be achieved independently of chamber pressure by using mass flow controllers to control flow rates and throttling the pumping system to control pressure.

TABLE 1

| Example of process conditions for etching AlScN | | |
| --- | --- | --- |
| | Start | End |
| Pressure (mTorr) | 10 | 2 |
| Coil Power (W) | 1000 | 1000 |
| Platen Power (W) | 675 | 975 |
| Ar % | 0-60 | 0-60 |
| $Cl_2$ | 100-40 | 100-40 |

As the scandium content in the AlScN increases, there is an increase in the production of non-volatile by-products during etching, resulting in a decreased etch rate. The composition of the redeposition is likely to reflect that of the AlScN sample being etched. Therefore it is expected that AlScN samples having a high Sc content will require a more physical etch to remove redeposition material. Additionally, in chemical etch process regimes, etch non-uniformity tends to worsen at higher scandium contents, which would ulti- mately impact underlayer loss.

The problems associated with etching can be overcome with appropriate tuning of the processes of the invention. For example, the conditions at the start of the process can be adapted by using a relatively low chamber pressure to assist in improving etch non-uniformity, and using a relatively high RF bias to reduce the build up of redeposition material. Subsequently, these process conditions are changed to move towards a still more physical etch regime while maintaining a high selectivity and etch rate. If the redeposition removal is sufficient, then at the end of the process the pressure can be increased and the RF bias decreased to increase the selectivity and etch rate. Other words, it is possible to change the process conditions to produce a more chemical etch regime at the end of the etch process. At the end of the etch process, there is a risk that the underlayer can be exposed to the etch, thereby damaging the underlayer. An advantage with using a more chemical etch regime at the end of the etch process is that any damage to exposed portions of the underlayer can be minimised. However, the use of a more chemical etch regime at the end of the etch process should be implemented so as to avoid a net build up of redeposition material. These tuning mechanisms offer a dynamic solution to overcoming the problem of redeposition whilst enabling a steep single-angled sidewall profile to be achieved. The processes described herein are effective in AlN doped with scandium atomic weight percentages up to 40%, i.e. for $Al_{1-x}Sc_xN$ where x is greater than 0 and less than or equal to 0.40, as measured by EDAX.

The duration and rate of change of the pressure and the RF bias power can be adjusted to tune the process characteris- tics. Three examples are provided, although the skilled reader will appreciate that many variations of these examples are possible.

Example 1

Figure 7:
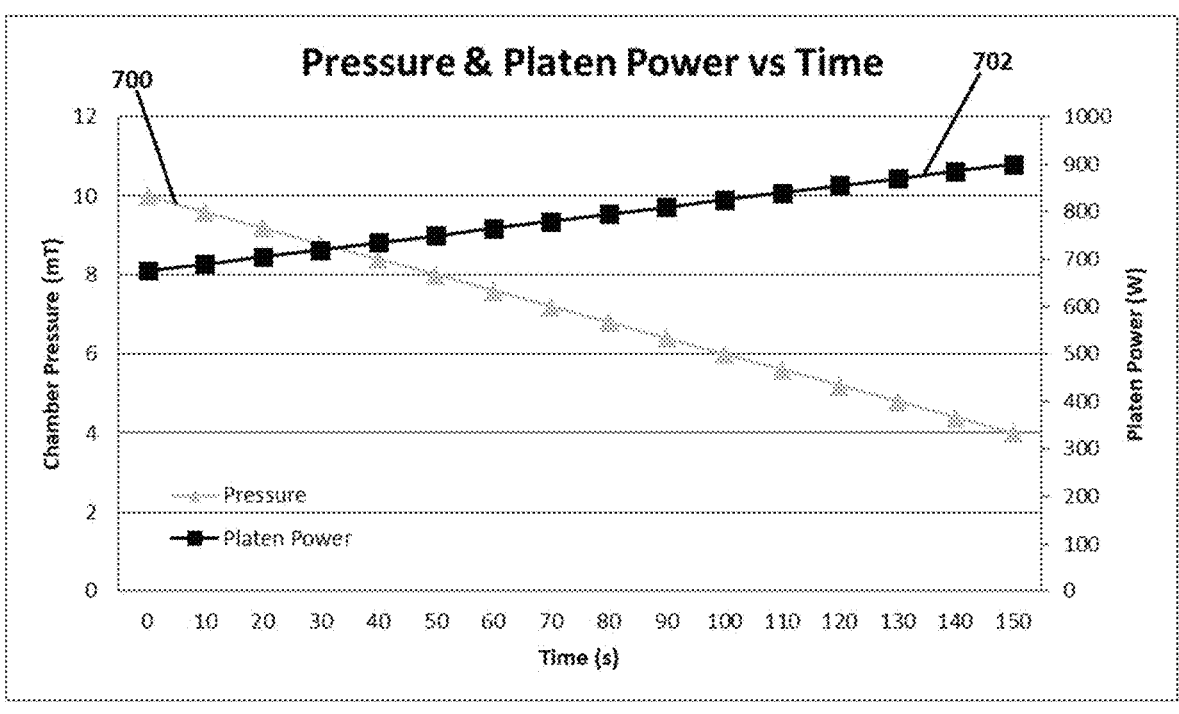
FIG. 7 is a plot showing a linear change in pressure and platen power against time.

The first example utilises a linear rate of change of pressure and RF bias power as a function of time. FIG. 7 illustrates an embodiment in which the pressure 700 decreases at a constant rate of 0.4 mTorr/s whilst the platen RF bias power 702 increases at a constant rate of 15 W/s. Gas flows into the chamber also decrease with the pressure.

Example 2

Figure 8:
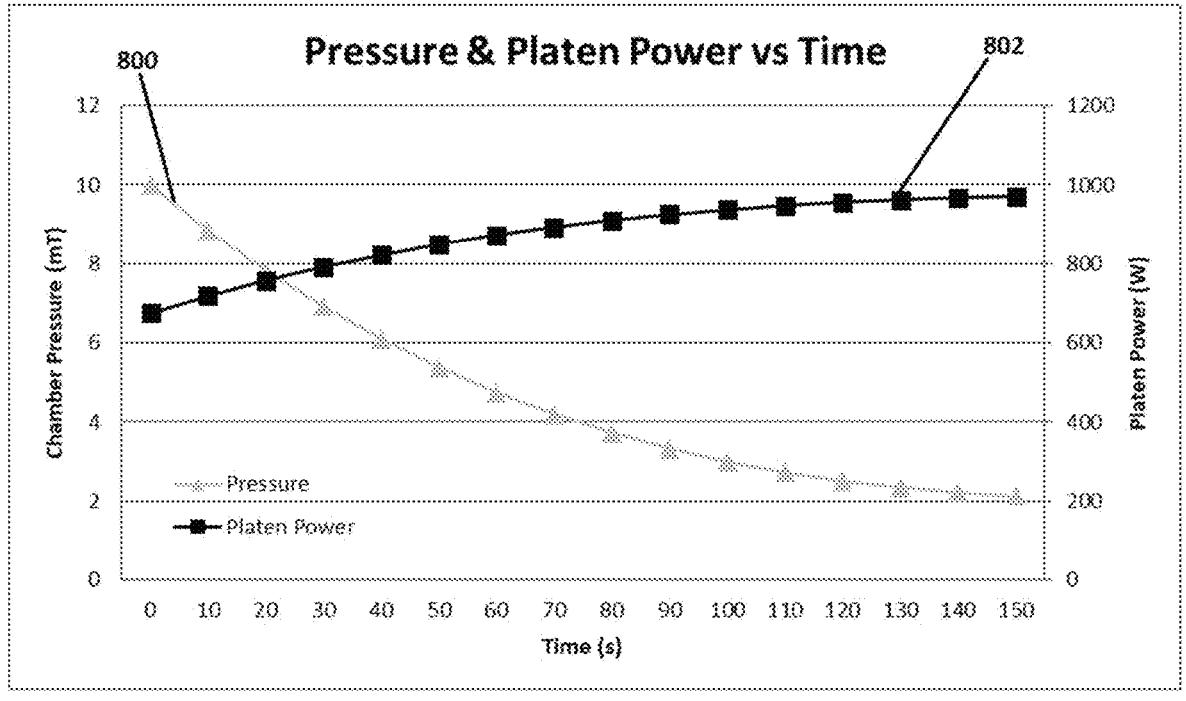
FIG. 8 is a plot demonstrating a negative non-linear variation in pressure and RF platen power against time.

The second example utilises a negative non-linear rate of change of pressure and RF bias power as a function of time. In other words, the rate of change of pressure and RF bias power decreases as a function of time. This drives the process to a more physical etch regime at a faster rate, which decreases the selectivity to the mask, but increases direc- tionality, helping to remove redeposition and maintain a steeper profile. FIG. 8 illustrates an embodiment in which this approach is used, and shows pressure 800 and RF bias power 802 as a function of time.

Example 3

Figure 9:
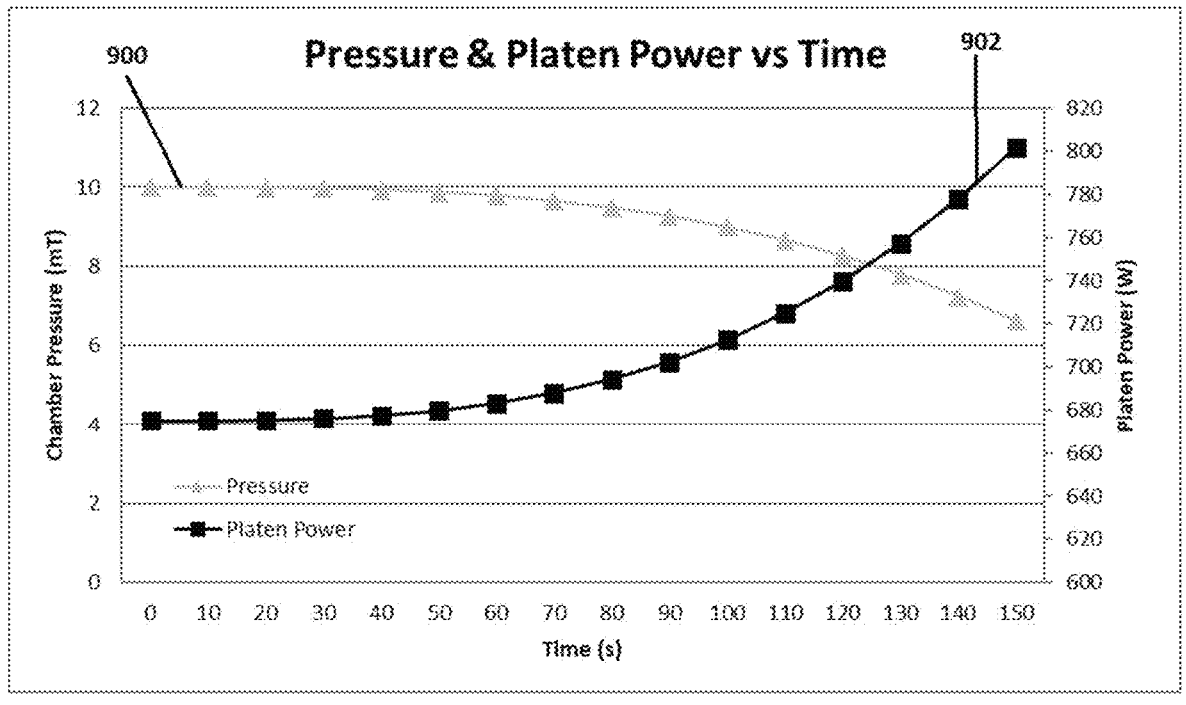
FIG. 9 is a plot showing a positive non-linear change in pressure and platen power against time.

In the third example, a positive non-linear rate of change of pressure and RF bias power as a function of time is utilised. In other words, the rate of change of pressure and RF bias power increases as a function of time. This increases the process time that is spent in a less directional, more chemical regime but also increases the selectivity to the mask at the beginning of the etch, thereby minimising mask recession. This type of process can allow thinner masks to be used. FIG. 9 illustrates an embodiment in which this approach is used, and shows pressure 900 and RF bias power 902 as a function of time.

Further variations and modifications are possible. For example, the invention can be utilised to etch AlYn and AlErN films. The Sc, Y or Er additive-containing aluminium nitride film can be provided in a range of forms, such as thin films, and on a range of substrates. Although it is generally convenient to alter the balance between chemical and physi- cal etching by ramping process parameters over the course of the etch, it is possible to hold a process parameter at a constant value for a period of time during the etch process. The holding of a process parameter at a constant value can be performed before and/or after the process parameter is varied.

The invention claimed is:

1. A method of plasma etching an additive-containing aluminium nitride film comprising:
    plasma etching an additive-containing aluminium nitride film containing an additive element selected from Sc, Y or Er through a mask with a plasma formed in a gaseous atmosphere having an associated gas pressure while an RF bias power is applied to the additive-containing aluminium nitride film during a first phase; and
    plasma etching the additive-containing aluminium nitride film through the mask for a period of time, t, during a second phase immediately after the first phase with the plasma formed in the gaseous atmosphere while the RF bias power is applied to the additive-containing alu- minium nitride film, wherein the gas pressure is reduced and/or the RF bias power is increased relative to the first phase for a majority of the period of time t, so that the plasma etching becomes less chemical and more physical relative to the first phase over the majority of the period of time, t.

2. The method according to claim 1, in which the gas pressure is reduced and/or the RF bias power is increased at a constant rate of change for a majority of the period of time t.

3. The method according to claim 1, in which the gas pressure is reduced at a rate of change that decreases for a majority of the period of time t.

4. The method according to claim 1, in which the RF bias power is increased at a rate of change that increases for a majority of the period of time t.

5. The method according to claim 1, in which the mask is a hard mask.

6. The method according to claim 1, in which the mask is a photoresist mask.

7. The method according to claim 1, in which the gas pressure is reduced and/or the RF bias power is increased for at least 75% of the period of time, t.

8. The method according to claim 1, in which the gas pressure is in the range 0.5 to 25 mTorr, during the plasma etching.

9. The method according to claim 1, in which the gas pressure is reduced by at least half for the majority of the period of time t.

10. The method according to claim 1, in which the RF bias power is in the range 0 to 1500 W during the plasma etching.

11. The method according to claim 1, in which the RF bias power is increased by an amount in the range 250 to 500 W for the majority of the period of time t.

12. The method according to claim 1, in which the gas pressure is increased and/or the RF bias power is reduced during a final portion of the plasma etching.

13. The method according to claim 1, in which a composition of the gaseous atmosphere is adjusted during the plasma etching, optionally so that the plasma etching becomes less chemical and more physical.

14. The method according to claim 13, in which the gaseous composition comprises a chlorine containing etch precursor and a noble gas.

15. The method according to claim 14, in which the ratio of the flow rate in sccm of the chlorine containing etch precursor to the combined flow rates in sccm of the chlorine containing etch precursor and noble gas in the gaseous atmosphere is adjusted between values which are in the range 40 to 100%.

16. The method according to claim 14, in which the chlorine containing etch precursor is $Cl_2$.

17. The method according to claim 14, in which the noble gas is Ar.

18. The method according to claim 1, in which the additive-containing aluminium nitride film is a thin film.

* * * * *